United States Patent [19]

Sanner

[11] Patent Number: 4,821,295

[45] Date of Patent: Apr. 11, 1989

[54] TWO-STAGE SYNCHRONIZER

[75] Inventor: Martin W. Sanner, San Jose, Calif.

[73] Assignee: Tandem Computers Incorporated, Cupertino, Calif.

[21] Appl. No.: 126,997

[22] Filed: Nov. 30, 1987

[51] Int. Cl.⁴ .............................................. H04L 7/02
[52] U.S. Cl. .................................... 375/110; 307/527
[58] Field of Search ................. 375/106, 110, 118, 87; 329/50; 307/527

[56] References Cited

U.S. PATENT DOCUMENTS 4,663,769  5/1987  Krinock ............................ 375/110
4,688,232  8/1987  Fox .................................... 375/87

Primary Examiner—Robert L. Griffin
Assistant Examiner—Marianne Huseman
Attorney, Agent, or Firm—Townsend and Townsend

[57] ABSTRACT

A method, and apparatus to implement that method, for synchronizing an incoming signal to the transitions of a digital clock signal in the form of a periodic pulse train. The apparatus includes a first circuit pair of flip-flops arranged to sample and store the state of the input signal on either the positive and negative transitions of the periodic pulse train, an OR gate producing a signal indicative of the stored content of the first circuit, and a third circuit that samples and stores the first signal at each transition of the periodic pulse train to produce therefrom a representation of the input signal synchronized to one of the transitions of the pulse train.

5 Claims, 1 Drawing Sheet

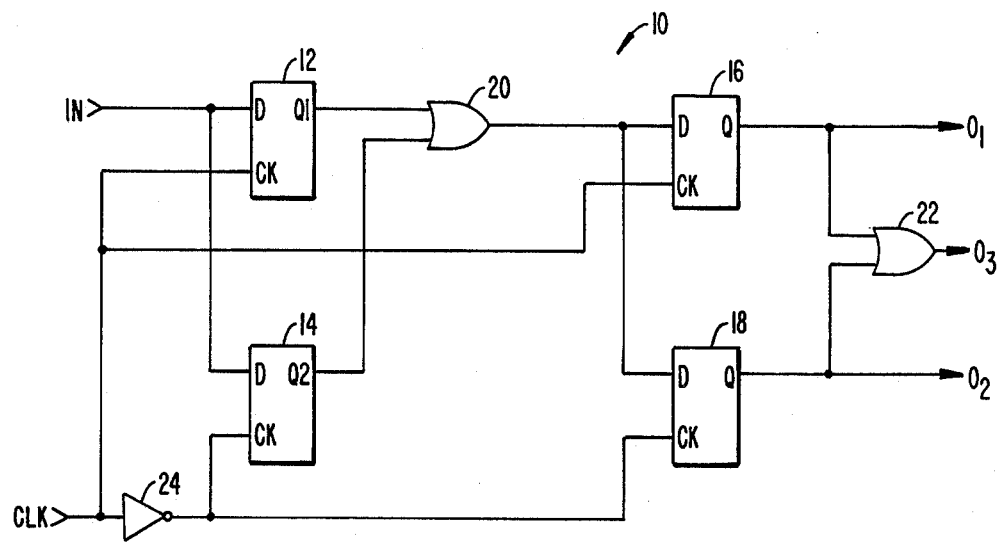
FIG._1.
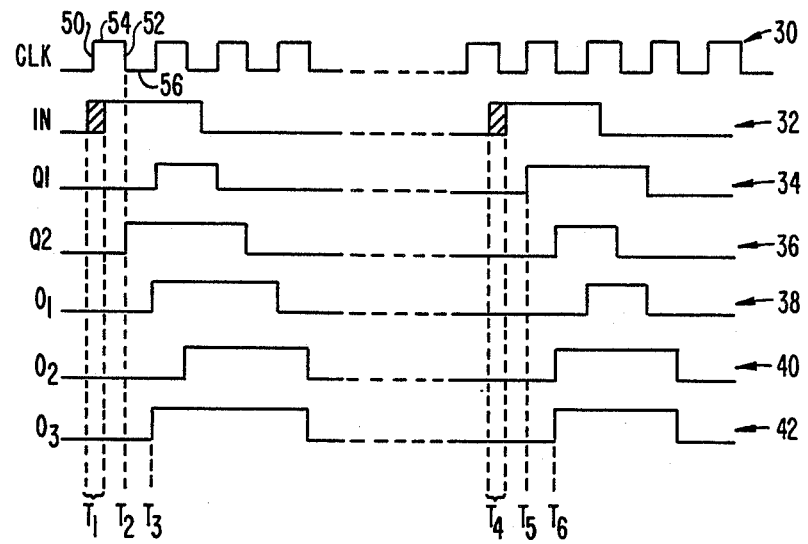
FIG._2.

TWO-STAGE SYNCHRONIZER

BACKGROUND OF THE INVENTION

The present invention is directed generally to digital equipment, and more particularly to apparatus for synchronizing transitions of an input signal to a transition of a digital clock signal in the form of a periodic pulse train within one period of the pulse train.

In digital systems, it is not unusual to control the transfer of data between independent units, such as a device controller and a peripheral device controlled thereby, using control strobe pulses or, as they are more usually called, "handshake" signals. Generally, a handshake signal will signify, for example, that a piece of data is present on the input/output lines connecting the peripheral device and its controller. The handshake can then be applied, along with a timing or clock signal (usually in the form of a periodic pulse train) to appropriate logic to effect proper data transfer (or other operations). In such circumstances, synchronization is desired, if not necessary, between the handshake and a clock to avoid generation of spurious signals.

Often, due to physical tolerances in the manufacture of the hardware used to control such systems, the relative position in time of the handshake signal and clock will vary over a range, even if the devices are driven in lock-step by a common clock. Such variations in the duration and timing of handshake signals cause problems where the handshake must be present in synchronism for the handshake to be recognized as valid.

More often, however, units that communicate with one another are synchronously operated by their own independent clocks so that the handshake signals between them appear asynchronously.

Further, because of the nature of presently known synchronizing circuits, synchronization cannot be achieved in less time than one clock period—even in a best case situation. However, in high-speed data transfers between, for example, a peripheral device and its corresponding controller, it is often necessary that data transfers occur in a time period that is no more than a clock period in order to prevent data overrun (i.e., incoming data overriding immediately preceding data). Data overrun problems can be cured by one of two methods: Adding more logic circuitry in the form of additional buffering (and multiplexing the incoming line to the separate buffers), or ensuring that the ultimate transfer of a first piece of incoming data is made before the immediately succeeding piece of data is lost (i.e., slow down the transfer rate). The former method adds expense and complexity to the system, the latter costs time.

SUMMARY OF THE INVENTION

Accordingly, the present invention provides, in a minimum of circuitry, apparatus for synchronizing an incoming signal to transitions of a periodic pulse train.

Broadly, the invention comprises the method of sampling and storing the input signal at each transition (i.e., each change of state) of the periodic pulse train with which the input signal is to be synchronized; producing from the sampled step a first signal that is indicative of the stored state of the input signal, sampling and storing the first signal at each transition of the periodic pulse train; and producing from the stored first signal a representation of the input signal that is synchronized with the periodic pulse train.

The invention disclosed is implemented by providing a first pair of flip-flops each respectively configured to sample and store the input signal on the positive and negative-going transitions of the periodic pulse train in the form of a digital clock signal ("clock"). The TRUE (Q) outputs of the flip-flops are connected to an OR gate, the output of which is sampled and stored at each clock transition by a second pair of flip-flops. The outputs of the second pair of flip-flops form synchronized versions of the input signal, having state transitions occurring substantially with those of clock. These output signals may be logically ORed by an OR gate to form a signal that is synchronized with both state changes of clock.

A number of advantages are achieved by the present invention. First, in a minimum number of circuit components, a two-stage synchronizer is formed capable of synchronizing the leading edge of an input signal to a transition of a clock signal—within one period of the clock, maximum.

These and other advantages and features of the present invention will become readily apparent to one skilled in the art upon reading the following detailed description of the invention, which should be taken in conjunction with the accompanying drawings.

BRIEF DESCRIPTION OF THE DRAWINGS

FIG. 1 is a circuit diagram of a two-stage synchronizer constructed in accordance with the teachings of the present invention disclosed herein; and FIG. 2 is a timing diagram, illustrating operation of the two-stage synchronizer of FIG. 1.

DETAILED DESCRIPTION OF THE INVENTION

Referring first to FIG. 1, there is illustrated a two-stage synchronizer, constructed in accordance with the teachings of the present invention and designated generally with the reference numeral 10. As constructed, the two-state synchronizer 10 operates to synchronize the transitions or state changes of an input signal (IN) to the transitions of a periodic pulse train in the form of a clock (CLK) signal. As FIG. 1 shows, the two-stage synchronizer 10 includes four Dtype flip-flops 12, 14, 16 and 18; a pair of OR gates 20 and 22, and an INVERTER 24. The IN signal, an aperiodic, asynchronously-appearing pulse, is coupled to the data (D) inputs of the flip-flops 12 and 14, while the CLK signal is coupled to the clock (CK) inputs of the flip-flops 12 and 16, and to the input of the INVERTER 24. The output of the INVERTER 24 is coupled to the clock (CK) inputs of the flip-flops 14 and 18. Thus, while the CK inputs of the flip-flops 12 and 14 receive the "true" version of the CLK signal, the CK inputs of the flip-flops 14 and 18 receive the inverted or phase-shifted (by 180°) version of the CLK signal.

The flip-flops are of the type that sample and store the state of the signal then appearing at the Dinput on the rising or positive-going edge of the signal applied to the CK input. Flip-flop 12, therefore, samples the IN signal on positive-going transitions of the CLK signal while the flip-flop 14 samples the IN signal on negative-going transitions of CLK. To put it another way, the pair of flip-flops 12, 14 operate to sample and store the state of the IN signal at each transition of the CLK signal The outputs (Q1 and Q2, respectively) of the flip-flops 12 and 14 are coupled to an OR gate 20 that, in turn, produces a first signal that is communicated to the data (D) inputs of the flip-flops 16 and 18. Similar to the pair of flip-flops 12, 14, the flip-flops 16 and 18 also respectively operate to sample and store the state of the first signal on each positive and negative-going transition of the CLK signal.

The outputs (Q) of the pair of flip-flops 16, 18 form the output signals $O_1$ and $O_2$ produced by the two-state synchronizer 10. In addition, the Q outputs of the flip-flops 16, 18 are coupled to the inputs of the OR gate 22 to produce a third signal, $O_3$. All three output signals $O_1$, $O_2$, $O_3$ each form a synchronized representation of the IN signal.

Referring now to FIG. 2, a timing diagram is shown to illustrate operation of the two-stage synchronizer 10 in which the CLK signal (waveform 30) is used to periodically sample the state of the IN signal (waveform 32) to produce synchronized representations in the form of the signals $O_1$, $O_2$ and $O_3$ (waveforms 38, 40 and 42).

The CLK signal (waveform 30), as FIG. 2 illustrates, is shown as having a 50% duty cycle, although that is not necessary to the present invention, and positive and negative-going transition between upper and lower logic states (or voltage levels) 54 and 56, respectively.

In operation, assume that prior to the time period $T_1$ (FIG. 2) the IN signal is at a lower or first state, and that during the time period $T_1$, the IN signal traverses to the higher or second assumable state. The time period $T_1$ is intended to indicate that period of time, relative to the rising edge 50 of the CLK signal, during which the flip-flops 12, 14 are "blind" to state changes of the IN signal; that is, state changes from a lower to a higher level of the IN signal occurring in the time period $T_1$ will not be seen, and the flip-flop 12 will, at the rising edge 50 of the CLK signal, store a LOW.

However, at the immediately succeeding, or negative, transition of the CLK signal the IN signal has had time to set up to the HIGH state and, therefore, the HIGH will be stored in the flip-flop 14 on the negative transition of CLK—at time $T_2$. The HIGH at the Q2 output of flip-flop 14 is communicated via the OR gate 20 to the data (D) inputs of the flip-flops 16 and 18 so that, at the next succeeding CLK transition, which in the example here will be positive-going, the flip-flop 16 will sample and store, in effect, the content of the flip-flops 12, 14, causing the output Q3 to go HIGH at time $T_3$. In turn, via the OR gate 22, the output signal $O_3$ (waveform 42) will also go HIGH. Thus, all three output signals $O_1$, $O_2$ and $O_3$ form a representation of the IN signal that is synchronized to the transitions of the CLK signal. A similar analysis can be made for the falling or negative-going transition of the IN signal.

Continuing with reference to FIG. 2, at time period $T_4$ another leading (positive) transition of the IN signal occurs around or shortly after a negative transition 52 of the CLK signal. Again, the transition of the IN signal is not seen by the flip-flops 12, 14 because of its closeness to the transition of the CLK signal. However, at the immediately succeeding transition of the CLk signal (time $T_5$) the IN signal has settled and, since this transition will be positive, the flip-flop 12 will sample and store the now HIGH state of the IN signal. Thereafter, at time $T_6$ (the next succeeding negative transition 52 of the CLK signal) the output Q4 from the flip-flop 18, and therefore the output signals $O_1$ and $O_3$ go HIGH (waveforms 38 and 42). Again, the output signals $O_1$ and $O_3$ form a representation of the IN signal that is synchronized to the rising or positive transition of the CLK signal.

One may ask what is the need for the second rank of flip-flops 16, 18. It will be noted that, in FIG. 2, synchronization appears to be achieved by the output of the OR gate 20. The answer is found in the metastability of flip-flops. If a transition of the IN signal occurs at exactly (or very close to exactly) the transition of the CLK signal, the output of the flip-flops 12, 14 will be indeterminate. In fact, the outputs can oscillate between a "one" and a "zero" state for a limited time. This situation is unacceptable. The second rank of flip-flops 16, 18 prevents this oscillation from propagating through to the rest of the circuit.

In summary, there has been disclosed a synchronizer circuit for synchronizing an input signal to a clock signal formed from a periodic pulse train.

What is claimed is:

1. Apparatus for synchronizing transition between first and second states of an input signal to positive or negative transitions occurring in a periodic pulse train, the apparatus comprising:
   first storage means coupled to receive the input signal for sampling and storing the state of the input signal at each positive transition of the periodic pulse train;
   second storage means coupled to receive the input signal for sampling and storing the state of the input signal at each negative transition of the periodic pulse train;
   first circuit means operable to produce a first signal indicative of the state of the input signal stored in the first or the second storage means; and
   second circuit means operable in response to the first signal and the pulse train to produce a representation of the input signal with the first and second state transitions synchronized with the transitions of the pulse train, the second circuit means including third storage means coupled to sample and store the first signal at each positive transition of the periodic pulse train, and fourth storage means coupled to sample and store the first signal at each negative transition of the periodic pulse train.

2. The apparatus of claim 1, wherein the first, second, third, and fourth storage means each include a D-type flip-flop.

3. The apparatus of claim 2, wherein each of the D-type flip-flops are edge-triggered.

4. The apparatus of claim 2, wherein each of the D-type flip-flops are edge triggered and operable to sample and store on each positive-going transition of the pulse train.

5. A method of synchronizing changes of state of an input signal to positive or negative transitions of a periodic pulse train, the method comprising the steps of:
   sampling and storing the state of the input signal at each transition of the periodic pulse train;
   producing a first signal indicative of the stored state of the input signal;
   sampling and storing the first signal at each transition of the periodic signal, and producing therefrom first and second representations of the input signal with changes of state occurring at each of the transitions of the periodic pulse train; and
   output circuit means for receiving the first and second representations to produce therefrom an output signal that is representative of the input signal, the output signal having changes of state occurring at the positive or negative transition of the periodic pulse train.

* * * * *